(12) United States Patent
Miyamoto et al.

(10) Patent No.: US 7,616,062 B2
(45) Date of Patent: Nov. 10, 2009

(54) RECEIVED-LIGHT AMPLIFIER

(75) Inventors: Shinichi Miyamoto, Kyoto (JP); Hideo Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 17 days.

(21) Appl. No.: 11/924,725

(22) Filed: Oct. 26, 2007

(65) Prior Publication Data

US 2008/0106338 A1    May 8, 2008

(30) Foreign Application Priority Data

Nov. 2, 2006 (JP) ............................. 2006-298912

(51) Int. Cl.
*H03F 3/08* (2006.01)
(52) U.S. Cl. .................. 330/308; 250/214 A
(58) Field of Classification Search ................ 330/308, 330/103–104; 250/214 A, 214 AG
See application file for complete search history.

(56) References Cited

U.S. PATENT DOCUMENTS

| | | | | |
|---|---|---|---|---|
| 7,335,872 | B2 * | 2/2008 | Fukuda et al. | .......... 250/214 A |
| 7,449,670 | B2 * | 11/2008 | Yamaguchi et al. | ..... 250/214 A |
| 2007/0075222 | A1 | 4/2007 | Fukuda et al. | |
| 2007/0075223 | A1 | 4/2007 | Murao et al. | |
| 2007/0108374 | A1 | 5/2007 | Fukuda et al. | |
| 2007/0228258 | A1 | 10/2007 | Yamaguchi et al. | |

FOREIGN PATENT DOCUMENTS

JP          8-154023          6/1996

OTHER PUBLICATIONS

English language Abstract of JP 8-154023.

* cited by examiner

*Primary Examiner*—Robert Pascal
*Assistant Examiner*—Hieu P Nguyen
(74) *Attorney, Agent, or Firm*—Greenblum & Bernstein, P.L.C.

(57) ABSTRACT

The present invention has as an object to provide, for received-light amplifiers capable of changing the current-voltage conversion efficiency by changing the resistance of feedback resistors, a received-light amplifier which can prevent the deterioration of output voltage linearity occurring when the current-voltage conversion efficiency is low. The present invention includes: a light-receiving device PD; a current amplification circuit which amplifies an output current of the light-receiving device PD, and outputs the amplified current; and a current-voltage conversion circuit which performs voltage-conversion on the output current from the current amplification circuit. The current amplification circuit includes: an operational amplifier; a feedback resistor Rgn1 connected between an inverting input terminal and an output terminal of the operational amplifier; a feedback resistor Rgn2 connected in parallel to the feedback resistor Rgn1; a feedback resistor Rgp connected between a non-inverting input terminal and the output terminal of the operational amplifier; and a transistor switch SW3 inserted between the feedback resistor Rgn2 and one of the output terminal and the inverting input terminal of the operational amplifier.

8 Claims, 5 Drawing Sheets

RECEIVED-LIGHT AMPLIFIER

BACKGROUND OF THE INVENTION

(1) Field of the Invention

The present invention relates to a received-light amplifier, and particularly to a photoelectric converting apparatus with a built-in light-receiving device.

(2) Description of the Related Art

In response to the increase in disk revolution speed during the reading of data, as well as the writing of data into various types of optical discs in optical disc apparatuses represented by the DVD-R drive apparatus and Blu-ray disc apparatus, in recent years there has been a demand for a received-light amplifier that can precisely amplify both the high frequency signal during data reading and the pulse signal during data writing. Such a received-light amplifier can be implemented through the shifting of the frequency band and the output voltage in accordance with the input signal.

FIG. 1 is a circuit diagram of the received-light amplifier described in Japanese Unexamined Patent Application Publication No. 08-154023.

This received-light amplifier includes the light-receiving device PD, the current-voltage conversion circuit 10, and the voltage amplification circuit 20.

In the current-voltage conversion circuit 10, the inverting input terminal of an operational amplifier 11 is connected to the cathode of the light-receiving device PD. The anode of the light-receiving device PD is grounded. Plural feedback resistors Rg-a, Rg-b are connected between the inverting input terminal and the output terminal of the operational amplifier 11, and respective feedback capacitors Ca and Cb are connected in parallel to each conversion resistor. In addition, the switch SW1, which selects a feedback resistor, is inserted between the feedback resistor Rg-b and the output terminal of the operational amplifier 11. A reference voltage source Vref is connected to the non-inverting input terminal of the operational amplifier 11. Resistors Rref-a and Rref-b are inserted between the non-inverting input terminal of the operational amplifier 11 and the reference voltage source Vref. In addition, the switch SW2, which selects a resistor, is inserted between the resistor Rref-b and the reference voltage source Vref.

In the voltage amplification circuit 20, the output terminal of the operational amplifier 11 is connected to the non-inverting input terminal of the operational amplifier 12. A reference voltage source Vref is connected to the inverting input terminal of the operational amplifier 12, via the resistor R1. The resistor R2 is connected between the inverting input terminal and the output terminal of the operational amplifier 12.

In the received-light amplifier having the above-mentioned structure, in the case where, for example, the switch SW1 is turned OFF and only the feedback resistor Rg-a is selected in order to select a conversion efficiency mode of a particular current-voltage conversion efficiency, only the feedback capacitor Ca operates so that the frequency characteristic is optimized. For example, in the case where the switch SW1 is turned ON and both the feedback resistor Rg-a and Rg-b are selected in order to select a conversion efficiency mode of another current-voltage conversion efficiency, the feedback capacitor Ca and Cb operate simultaneously and the frequency characteristic is optimized.

SUMMARY OF THE INVENTION

According to the above-mentioned conventional received-light amplifier, even when the strength of the light reflected from an optical disc and incident to the light-receiving device varies due to differences in optical disc standards as well as the differences in writing/reading, it is possible to adjust the frequency characteristic to conform with the optical disc type as well as the writing/reading since it is possible to obtain a constant output voltage since the current-voltage conversion efficiency of the current-voltage conversion circuit can be changed, and it is possible to change the feedback capacitors that are to be used simultaneously.

Meanwhile, in the case where the amount of light incident to the light-receiving device is sufficient as when the reflection efficiency from the optical disc is high and the rate of revolution of the optical disc is low, there is a need to reduce the current-voltage conversion efficiency of the current-voltage conversion circuit. Since the efficiency in converting the incident light into current in the light-receiving device per se is constant, in this case, the resistance of the feedback resistor needs to be reduced.

However, in the case where, for example, a vertical PNP transistor, or the like, is used as a switch for switching the resistance of the feedback resistor, the linearity of the current-voltage conversion efficiency deteriorates when the resistance of the feedback resistor is reduced. FIG. 2 shows an example of the relationship of the current flowing in the switch transistor serving as a switch for switching the resistance of the resistor and the on-resistance of the switch transistor. As is clear in the figure, the on-resistance of the switch transistor has a non-linear distortion of about $500 \pm 100 \Omega$ depending on the flowing current. Therefore, although the output voltage Vout of the received-light amplifier is expressed as Vout=(Rg+Ron)×Iin, where the resistance of the feedback resistor is Rg, the on-resistance of the switch transistor is Ron, and the output current of the light-receiving device is Iin, due to the non-linear distortion, there occurs the problem in which output voltage Vout is not proportional with the amount of light incident to the light-receiving device. Note that in the case where the current-voltage conversion efficiency of the current-voltage conversion circuit is high, in other words, in the case where Rg is comparatively higher compared to Ron, such a problem does not occur since the non-linear distortion of Ron becomes relatively small.

Consequently, in view of the aforementioned problem, the present invention has as an object to provide, for received-light amplifier capable of changing the current-voltage conversion efficiency by changing the resistance of the feedback resistor, a received-light amplifier which can prevent the deterioration of output voltage linearity which occurs in the case where the current-voltage conversion efficiency is low.

In order to achieve the aforementioned object, the received-light amplifier according to the present invention is a received-light amplifier including: a light-receiving device; a current amplification circuit which amplifies an output current from the light-receiving device, and outputs the amplified current; and a current-voltage conversion circuit which performs voltage-conversion on the output current from the current amplification circuit, wherein the current amplification circuit includes: a first operational amplifier; a first feedback resistor connected between an inverting input terminal and an output terminal of the first operational amplifier; a second feedback resistor connected in parallel to the first feedback resistor; a third feedback resistor connected between a non-inverting input terminal and the output terminal of the first operational amplifier; and a first switch inserted between the second feedback resistor and one of the output terminal and the inverting input terminal of the first operational amplifier.

Accordingly, a differential input type current amplification circuit which allows the changing of the current amplification rate is inserted between the light-receiving device and the current-voltage conversion circuit. Here, since the current amplification rate of the current amplification circuit is determined according to the ratio of the resistance between the non-inverting input terminal and the output terminal of the operational amplifier and the resistance between the inventing input terminal and the output terminal of the operational amplifier, the current amplification rate is not influenced by the absolute values of these resistances As such, the resistances can be set relatively freely and, thus, by making the resistance of either the first feedback resistor or the second feedback resistor sufficiently higher than the on-resistance switch, the influence of the non-linear distortion of the on-resistance of the switch can be suppressed to a minimum, and it is possible to prevent the aforementioned output voltage linearity deterioration occurring when the current-voltage conversion efficiency is low.

Here, it is also possible that the respective resistances of the first feedback resistor and the second feedback resistor are not less than 500Ω.

Although the on-resistance of the switch is about 500Ω, with this it is possible to comparatively reduce the percentage of the on-resistance of the switch in the feedback resistance, and it is possible to further reduce the non-linear distortion due to the on-resistance of the switch.

Furthermore, it is also possible that the first switch performs switching so that resistance between the inverting input terminal and the output terminal of the first operational amplifier becomes lower than resistance between the non-inverting input terminal and the output terminal of the first operational amplifier.

Accordingly, it is possible to make the current amplification rate of the current amplifier circuit 1 or less, and attenuate the output current. Therefore, it is possible to flexibly handle changes in the current-voltage conversion efficiency of the current-voltage conversion circuit at the subsequent stage.

According to the present invention, in a received-light amplifier capable of changing the current-voltage conversion efficiency by changing the resistance of resistors, it is possible to prevent the deterioration of output voltage linearity occurring in the case where the current-voltage conversion efficiency is low.

FURTHER INFORMATION ABOUT TECHNICAL BACKGROUND TO THIS APPLICATION

The disclosure of Japanese Patent Application No. 2006-298912 filed on Nov. 2, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereinafter, the received-light amplifier according to the embodiments of the present invention shall be described with reference to the drawings.

First Embodiment

Figure 3:
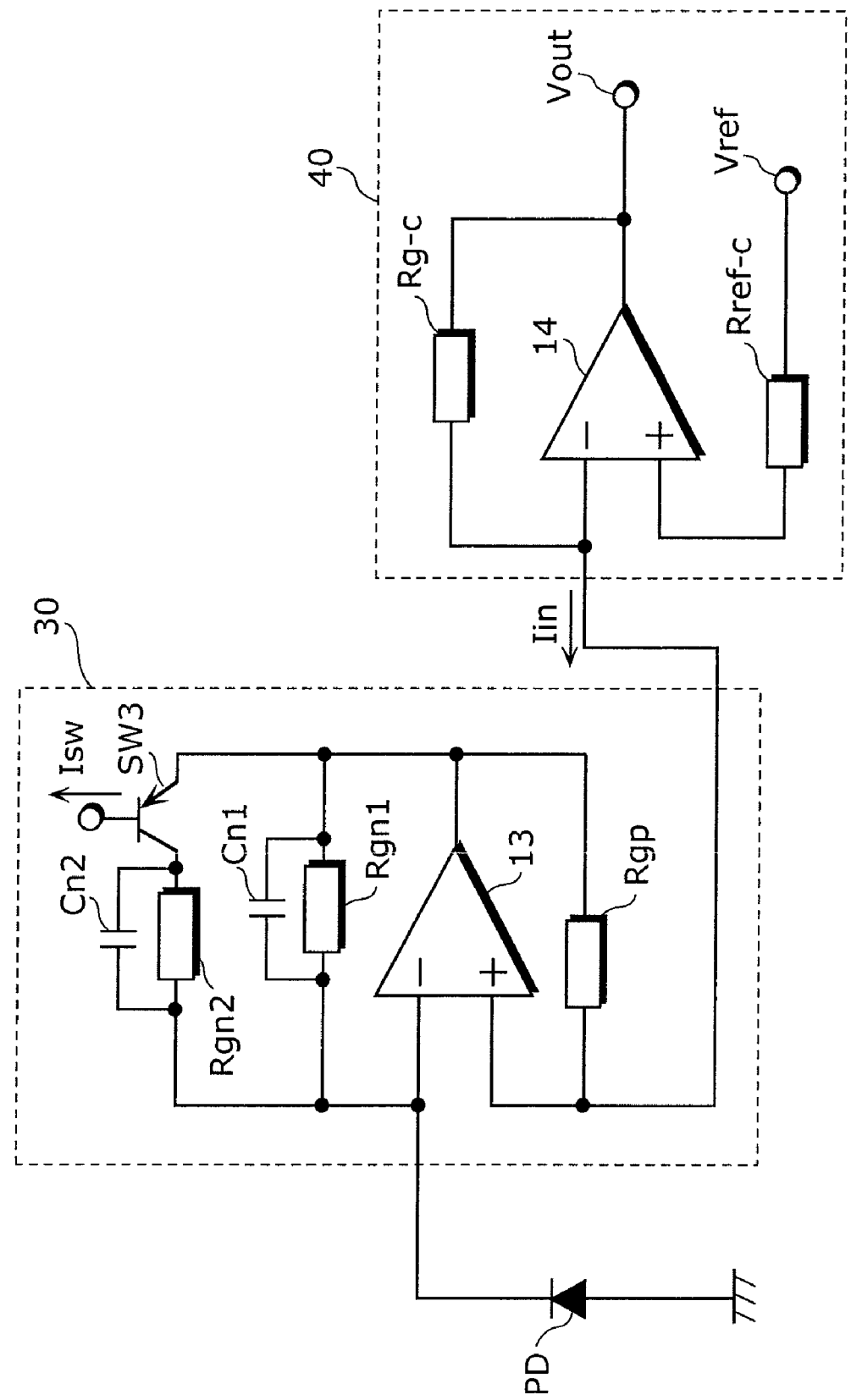
FIG. 3 is a circuit diagram of the received-light amplifier according to the first embodiment of the present invention.

Hereinafter, the received-light amplifier according to the present embodiment shall be described. FIG. 3 is a circuit diagram of the received-light amplifier.

As shown in FIG. 3, the received-light amplifier includes a light-receiving device PD, a current amplification circuit 30 which is of a differential input type and which amplifies an output current of the light-receiving device PD and outputs the current, and a current-voltage conversion circuit 40 which performs voltage conversion on the output current from the current amplification circuit 30.

In the current amplification circuit 30, a cathode of the light-receiving device PD is connected to the inverting input terminal of an operational amplifier 13. An anode of the light-receiving device PD is connected to a ground potential GND. A feedback resistor Rgn1 is connected between the inverting input terminal and an output terminal of the operational amplifier 13, and a feedback resistor Rgn2 is connected in parallel to the feedback resistor Rgn1. Feedback capacitances Cn1 and Cn2 are connected in parallel to the feedback resistors Rgn1 and Rgn2, respectively. A feedback resistor Rgp is connected between a non-inverting input terminal and an output terminal of the operational amplifier 13. Inserted between the feedback resistor Rgn2 and the output terminal of the operational amplifier 13 is a transistor switch SW3, the turning ON and OFF of which is controlled by a switch current Isw from the outside. The transistor switch SW3, in conjunction with the switch current Isw, selects an arbitrary feedback resistor from the feedback resistors Rgn1 and Rgn2 and switches the current amplification rate. The output current of the current amplification circuit 30 is obtained from between the non-inverting input terminal of the operational amplifier 13 and the feedback resistor Rgp. The current amplified by the current amplification circuit 30 is inputted to the current-voltage conversion circuit 40.

Here, the respective resistances of the feedback resistors Rgn1 and Rgn2 are not less than 500Ω.

In the current-voltage conversion circuit 40, an inverting input terminal of an operational amplifier 14 is connected between the non-inverting input terminal and the output terminal of the operational amplifier 13. A feedback resistor Rg-c is connected between the inverting input terminal and an output terminal of the operational amplifier 14. A reference voltage source Vref is connected to the non-inverting input terminal of the operational amplifier 14, via a resistor Rref-c. The current-voltage conversion circuit 40 performs current-voltage conversion on the current amplified by the current amplification circuit 30, and an output voltage Vout is obtained. Note that although feedback capacitors are not connected in parallel to the feedback resistor Rg-c in the current-voltage conversion circuit 40, it is also possible to have feedback capacitors connected in parallel to the feedback resistor Rg-c. Since the relationship between the input current and the output voltage in the current-voltage conversion circuit 40 can be expressed as Vout=Iin×Rg-c, where the resistance of the feedback resistor Rg-c is Rg-c, the input current is Iin, the output voltage is Vout when Vref serves as reference, the current-voltage conversion efficiency is determined according to Rg-c.

Note that the operational amplifier 13 is an example of a first operational amplifier of the present invention, and the operational amplifier 14 is an example of a second operational amplifier of the present invention. Furthermore, the feedback resistor Rgn1 is an example of a first feedback resistor of the present invention, the feedback resistor Rgn2 is an example of a second feedback resistor of the present invention, and the feedback resistor Rgp is an example of a third feedback resistor of the present invention. In addition, the transistor switch SW3 is an example of a first switch of the present invention.

In the received-light amplifier having the above-mentioned structure, the current amplification rate is determined by Rgn/Rgp where Rgn1 is the resistance of the feedback resistor Rgn1, Rgn2 is the resistance of feedback resistor Rgn2, Rgn is the combined resistance of the feedback resistors Rgn1 and Rgn2, and Rgp is the resistance of the feedback resistor Rgp. Rgn is Rgn1 when the transistor switch SW3 is OFF, and is Rgn1×(Rgn2+Ron)/(Rgn1+Rgn2+Ron) when the on-resistance of the transistor switch SW3 is assumed as Ron when the transistor switch SW3 is ON. By changing the current amplification efficiency by turning the transistor switch SW3 ON and OFF in conformance with the amount of light incident to the light-receiving device PD from outside the received-light amplifier, a received-light amplifier capable of handling various amounts of light can be obtained.

Figure 1:
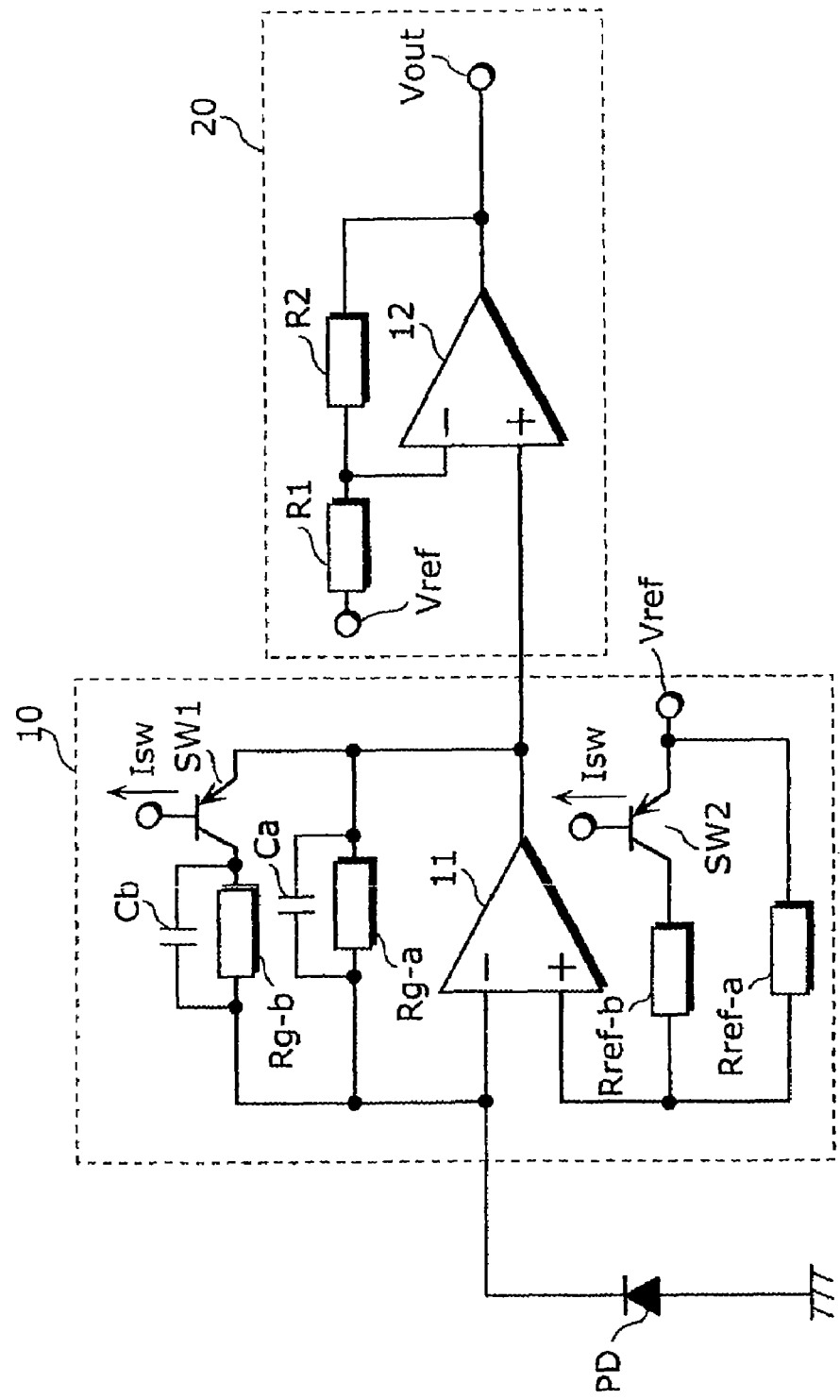
FIG. 1 is a circuit diagram of the conventional received-light amplifier.
Figure 2:
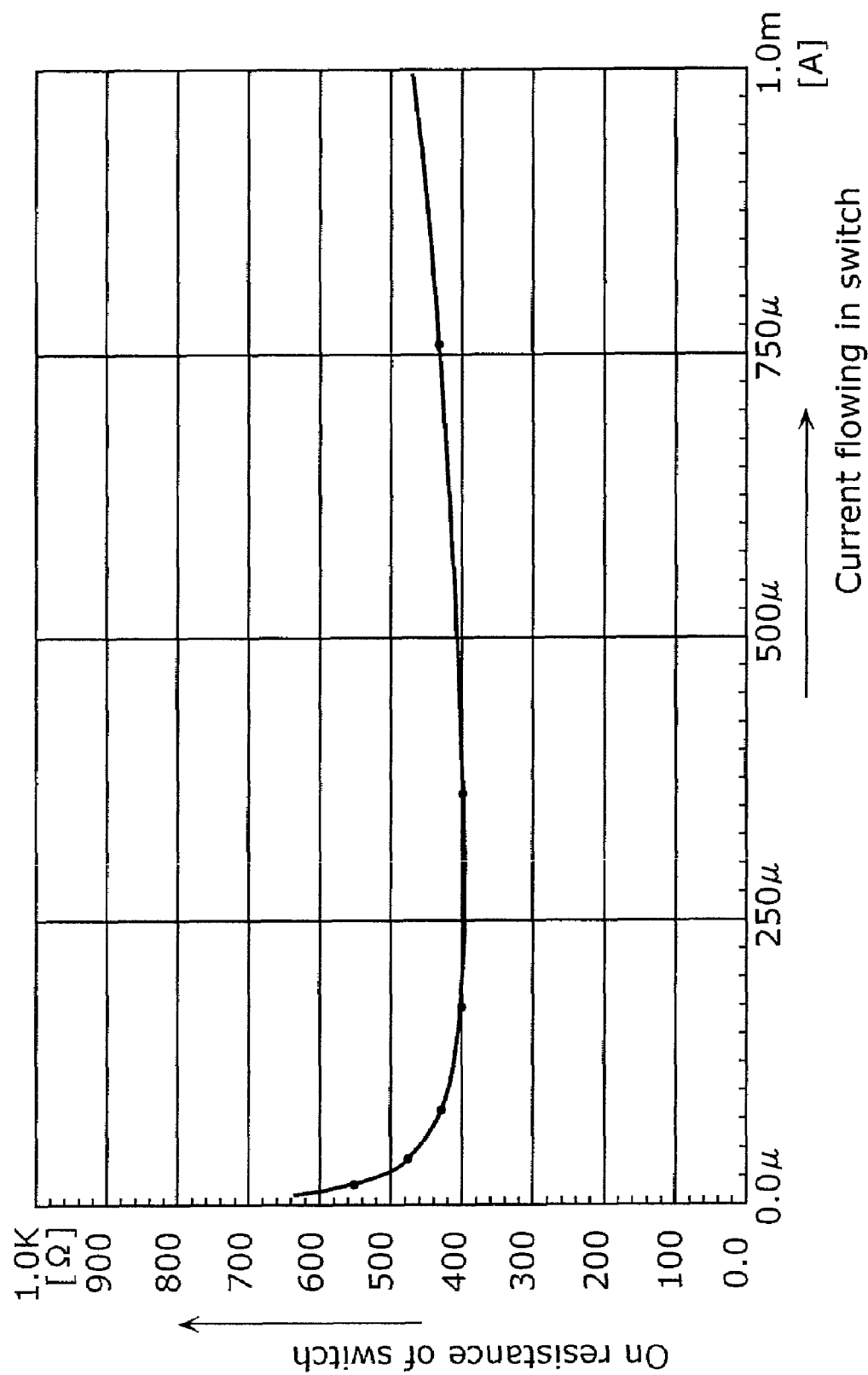
FIG. 2 is a diagram showing the characteristics of the on-resistance of the transistor switch.

Here, as mentioned above, Ron has a non-linear distortion and changes according to the current flowing in the transistor switch SW3. In the case where the transistor switch SW3 is configured of, for example, a vertical PNP bipolar transistor and the like, as shown in FIG. 2, Ron has for example a non-linear distortion of 500±100Ω. Therefore, when Rgn2 is reduced to about the same 500Ω as in Ron, this distortion has a big influence on the distortion of the current amplification rate. For example, assuming that in the case where the current amplification rate is switched between 1 and 0.091 by SW, the resistances are Rgn1=10 kΩ, Rgn2=500Ω, and Rgp=10 kΩ. Here, in the case where Ron is constant and Ron=500Ω, when Rgn is assumed as the combined resistance of the feedback resistors Rgn1, Rgn2 and the transistor switch SW3, Rgn is expressed as Rgn=Rgn1×(Rgn2+Ron)/(Rgn1+Rgn2+Ron) =912Ω, and the current amplification rate of the current amplification circuit 30 becomes 0.091. However, when the above-mentioned distortion is taken into consideration, Rgn is expressed as Rgn=912±79Ω (±8.7%), and the current amplification rate of the current amplification circuit 30 is expressed as Rgn/Rgp=0.091±0.008 (±8.7%), that is, the current amplification rate is distorted. However, in the above-mentioned received-light amplifier, the current amplification rate is determined by Rgn/Rgp and is not dependent on the absolute value of the resistance, and thus, by setting Rgp to an appropriate value, it is possible to make Rgn1 sufficiently higher than the on-resistance while keeping the current amplification rate constant. For example, in the case where the same current amplification rate is desired, the respective resistances are set as Rgn1=50 kΩ, Rgn2=4.5 kΩ, and Rgp=50 kΩ. As a result, the value of Rgn2 can be set so as to be sufficiently higher than the on-resistance. Accordingly, even with the same on-resistance distortion of 500±100Ω, since Rgn is expressed as Rgn=4550±77Ω (±1.7%), and the current amplification rate becomes 0.091±0.0015 (±1.7%), it is possible to reduce only the distortion while keeping the current amplification rate the same.

Stated differently, in the case where the resistance of Rgn1 and Rgn2 are made to be not less than 100 times and not less than 9 times the on-resistance Ron of the transistor switch SW3 respectively, the distortion of Rgn due to on-resistance Ron can be kept to 2% or less. More preferably, the resistance of Rgn1 and Rgn2 are may be made to be not less than 200 times and not less than 20 times the on-resistance Ron of the transistor switch SW3, respectively.

As described thus far, according to the received-light amplifier in the present embodiment, the differential input type current amplification circuit 30 which allows changing of the amplification rate, is inserted between the light-receiving device PD and the current-voltage conversion circuit 40. Furthermore, since the current amplification rate of the current amplification circuit 30 is determined according to the ratio of the resistances of the feedback resistors Rgn1 and Rgn2, and the resistance of the feedback resistor Rgp, the current amplification rate is not influenced by the absolute values of these resistances. As such, the resistances of the feedback resistors Rgn1, Rgn2 and the feedback resistor Rgp can be set relatively freely. As a result, by making the resistances of the feedback resistors Rgn1 and Rgn2 sufficiently higher than the transistor switch SW3 on-resistance Ron, the influence of the non-linear distortion of the on-resistance of the transistor switch SW3 can be suppressed to a minimum, and it is possible to prevent the output voltage linearity deterioration occurring when the current-voltage conversion efficiency is low.

Note that in the received-light amplifier in the present embodiment, in the case of switching the current amplification rate of the current amplification circuit 30, the transistor switch SW3 is turned ON/OFF, and an arbitrary feedback resistor is selected from the two feedback resistors Rgn1 and Rgn2 which are connected in parallel between the inverting input terminal and the output terminal of the operational amplifier 13. However, the same effect can be obtained by providing a new feedback resistor connected in parallel to the feedback resistor Rgp between the non-inverting input terminal and output terminal of the operational amplifier 13, and further providing a new transistor switch which selects an arbitrary feedback resistor from these two feedback resistors, and switching the current amplification rate by turning such transistor switch ON/OFF.

Second Embodiment

Figure 4:
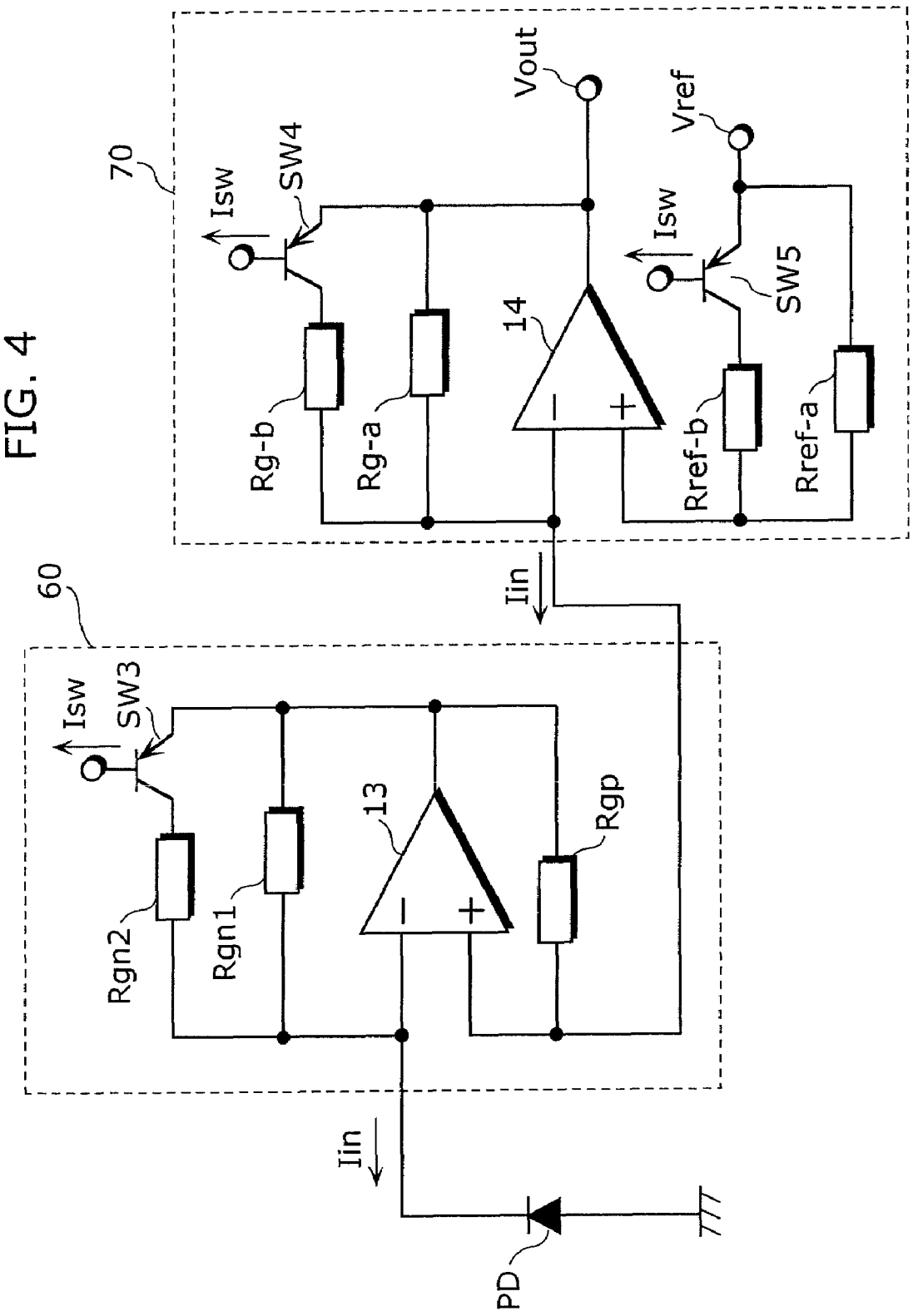
FIG. 4 is a circuit diagram of the received-light amplifier according to the second embodiment of the present invention.

Hereinafter, the received-light amplifier according to the present embodiment shall be described. FIG. 4 is a circuit diagram of the received-light amplifier.

The received-light amplifier is different from the received-light amplifier in the first embodiment in that, in order to be able to further comply with various amounts of light so as to comply with various types of optical disc media, recorded from low-speed recording to high-speed recording, the current-voltage conversion circuit is provided with a function for switching the current-voltage conversion efficiency.

As shown in FIG. 4, the received-light amplifier includes a light-receiving device PD, a current amplifier circuit 60 which is of a differential input type and which amplifies an output current of the light-receiving device PD and outputs the current, and a current-voltage conversion circuit 70 which performs voltage conversion on the output current from the current amplifier circuit 60.

In the current amplifier circuit 60, a cathode of the light-receiving device PD is connected to the inverting input terminal of an operational amplifier 13. An anode of the light-receiving device PD is connected to a ground potential GND. A feedback resistor Rgn1 is connected between the inverting input terminal and an output terminal of the operational amplifier 13, and a feedback resistor Rgn2 is connected in parallel to the feedback resistor Rgn1. A feedback resistor Rgp is connected between a non-inverting input terminal and an output terminal of the operational amplifier 13. Inserted between the feedback resistor Rgn2 and the output terminal of the operational amplifier 13 is a transistor switch SW3, the turning on and off of which is controlled by a switch current Isw from the outside. The transistor switch SW3, in conjunction with the switch current Isw, selects an arbitrary feedback resistor from the feedback resistors Rgn1 and Rgn2 and switches the current amplification rate. The output current of the current amplifier circuit 60 is obtained from between the non-inverting input terminal of the operational amplifier 13 and the feedback resistor Rgp. The current amplified by the current amplifier circuit 60 is inputted to a current-voltage conversion circuit 70.

In the current-voltage conversion circuit 70, an inverting input terminal of an operational amplifier 14 is connected between the non-inverting input terminal and the output terminal of the operational amplifier 13. A feedback resistor Rg-a is connected between the inverting input terminal and an output terminal of the operational amplifier 14, and a feedback resistor Rg-b is connected in parallel to the feedback resistor Rg-a. Inserted between the feedback resistor Rg-b and the output terminal of the operational amplifier 14 is a transistor switch SW4, the turning on and off of which is controlled by a switch current Isw from the outside. The transistor switch SW4, in conjunction with the switch current Isw, selects an arbitrary feedback resistor from the feedback resistors Rg-a and Rg-b and switches the current amplification rate. A reference voltage source Vref is connected to the non-inverting input terminal of the operational amplifier 14. A resistor Rref-b is inserted between the non-inverting input terminal of the operational amplifier 14 and the reference voltage source Vref, and a resistor Rref-a is connected in parallel to the resistor Rref-b. Inserted between the resistor Rref-b and the reference voltage source Vref is a transistor switch SW5, the turning on and off of which is controlled by a switch current Isw from the outside. The transistor switch SW5, in conjunction with the switch current Isw, selects an arbitrary resistor from the resistors Rref-b and Rref-a and switches the current amplification rate. The current-voltage conversion circuit 70 performs current-voltage conversion on current amplified by the current amplifier circuit 60, and an output voltage Vout is obtained.

Note that the feedback resistor Rg-a is an example of a fourth feedback resistor of the present invention, and the feedback resistor Rg-b is an example of a fifth feedback resistor of the present invention. In addition, the transistor switch SW4 is an example of a second switch of the present invention.

In the received-light amplifier having the above-mentioned structure, when Rg-a is the resistance of the feedback resistor Rg-a, Rg-b is the resistance of the feedback resistor Rg-b, Rgn is the combined resistance of the feedback resistors Rg-a, Rg-b and the transistor switch SW4, the current-voltage conversion efficiency of the current-voltage conversion circuit 70 is determined by Rg-a when the transistor switch SW4 is OFF, and determined by Rg-a×(Rg-b+Ron)/(Rg-a+Rg-b+Ron) when the transistor switch SW4 is ON.

As described thus far, according to the received light amplifier in the present embodiment, it is possible to prevent output voltage linearity deterioration occurring when the current-voltage conversion efficiency is low, for the same reason as in the received-light amplifier in the first embodiment.

Furthermore, according to the received-light amplifier in the present embodiment, since it is possible to comply with a total of four patterns of light amount; two patterns using the current amplification circuit 60 and two patterns using the current-voltage conversion circuit 70, various types of media can be handled. Note that in order to comply with four patterns of sensitivity using the current amplification circuit 60, it is possible to comply with four patterns of light amount by providing four feedback resistors Rgn1, Rgn2, Rgn3, and Rgn4 in the current amplification circuit 60 and switching among these. However, in this case, it becomes difficult to realize a frequency characteristic conforming to each of the sensitivities in the current amplification circuit 60, and thus it is preferable to switch sensitivities also using the current-voltage conversion circuit 70.

Here, when the respective resistances of the feedback resistors Rg-a and Rg-b become low, the non-linear distortion of the transistor switch SW4 on-resistance Ron cannot be disregarded, in the same manner as with the current amplification circuit 60. However, when the resistances of the feedback resistors Rg-a and Rg-b are increased so that the influence of the on-resistance Ron can be disregarded, the current-voltage conversion efficiency rises since, unlike with the current amplification circuit 60, the resistances of the feedback resistors Rg-a and Rg-b correspond to the current-voltage conversion efficiency per se. As a result it becomes impossible to obtain low current-voltage conversion efficiency. In such a case, an arbitrary resistor is selected, by the transistor switch SW3, from the feedback resistors Rgn1 and Rgn2, in such a manner that the resistance between the inverting input terminal and the output terminal of the operational amplifier 13 becomes lower than the resistance between the non-inverting input terminal and the output terminal of the operational amplifier 13 thereby making Rgn<Rgp, and by increasing the resistances of the feedback resistors Rg-a and Rg-b accordingly, it becomes possible for the received-light amplifier to reduce the non-linear distortion of the current-voltage conversion circuit 70 with apparently the same light-receiving sensitivity.

Third Embodiment

Figure 5:
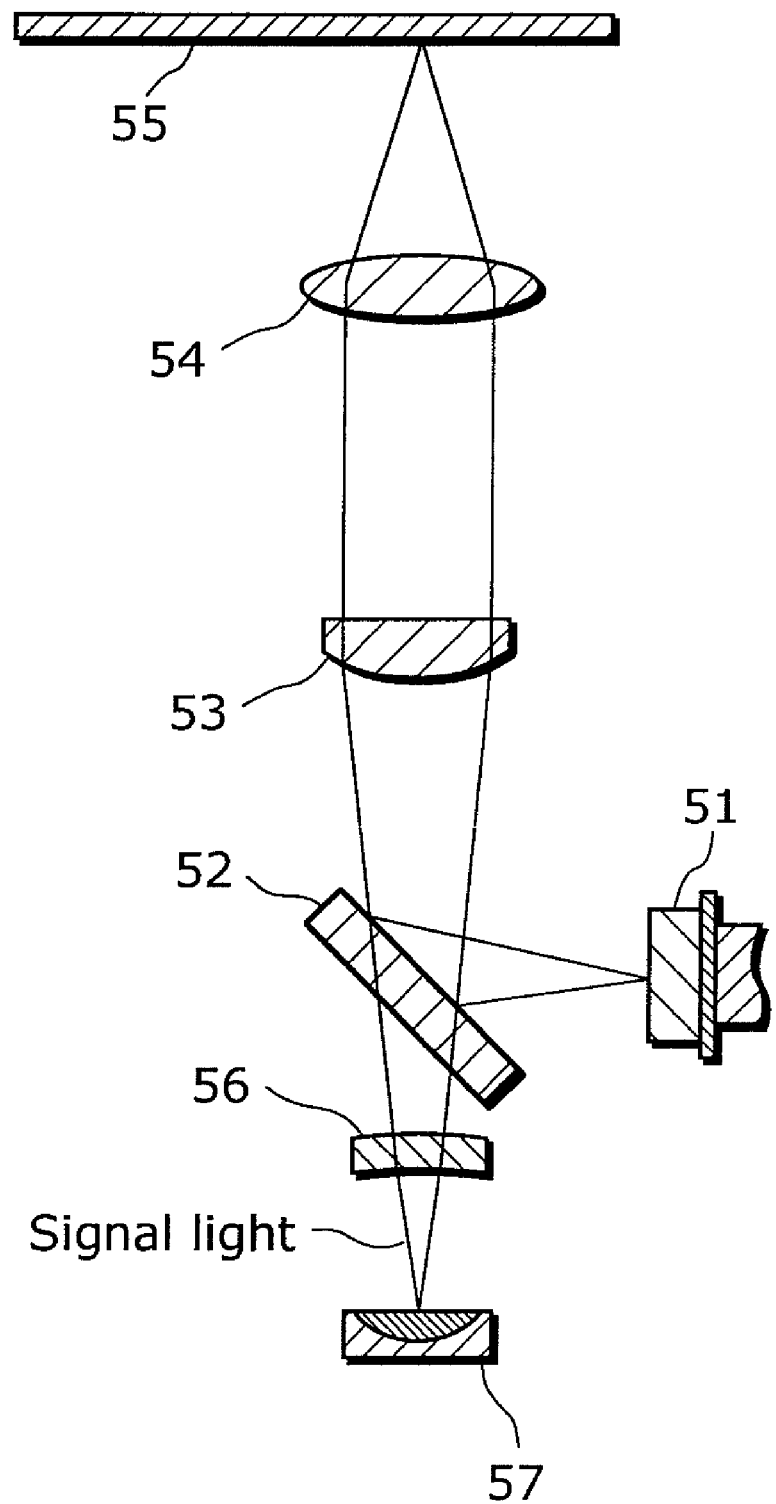
FIG. 5 is a diagram showing the structure of the optical pick-up apparatus according to third embodiment of the present invention.

Hereinafter, the optical pick-up apparatus according to the present embodiment shall be described. FIG. 5 is a diagram showing an example of the structure of the optical pick-up apparatus.

The optical pick-up apparatus is an apparatus for an optical disk drive which records and reproduces information to and from an optical disk medium 55 using a laser beam. As shown in FIG. 5, the optical pick-up apparatus includes: a laser device 51; a photoelectric conversion device 57 having the received-light amplifier in the first or second embodiment; and a light-collecting lens 56, a half mirror 52, a collimating lens 53, and an objective lens 54 which are arranged in sequence above the photoelectric conversion device.

As described above, the optical pick-up apparatus in the present embodiment includes a photoelectric conversion device 57 having the received-light amplifier in the first or second embodiment. Therefore, it is possible to implement an optical pick-up apparatus that can output a signal that is accurately proportional with the amount of light incident to the light-receiving device without signal deterioration in the photoelectric conversion device, even in the case where the current-voltage conversion efficiency is changed in conformance to the change in the amount of light incident to the received-light amplifier such as in the case of changing speed for changing the various types of media and reading/writing.

Although the received-light amplifier and the optical pick-up apparatus of the present invention has been described based on the embodiments thus far, the present invention is not limited to these embodiments. Various modifications that may be conceived by a person skilled in the art without departing from the substance of the present invention are intended to be included within the scope of the present invention.

For example, in the above-mentioned embodiments, the transistor switch SW may be configured of an FET. The present invention is also useful in this case since the transistor switch SW has a non-linear distortion.

Furthermore, the above-mentioned embodiments describe the case where there are two types of feedback resistors each for the current amplification circuit and the current-voltage conversion circuit and there is one switch each for switching the feedback resistors, in other words, the case of having a four-pattern sensitivity switching function. However, it is also possible for the current amplification circuit and the current-voltage conversion circuit to include more feedback resistors and the number of sensitivities that can be complied with can be increased.

Furthermore, although the transistor switch SW3 which selects an arbitrary resistor from the feedback resistors Rgn1 and Rgn2 is inserted between the feedback resistor Rgn2 and the operational amplifier 13, it may also be inserted between the feedback resistor Rgn2 and the inverting input terminal of the operational amplifier 13.

INDUSTRIAL APPLICABILITY

The present invention as useful in a received-light amplifier, and is particularly useful as an optical pick-up received-light amplifier and the like with built-in light-receiving device, which complies with various media.

What is claimed is:

1. A received-light amplifier comprising:
a light-receiving device;
a current amplification circuit which amplifies an output current from said light-receiving device, and outputs the amplified current; and
a current-voltage conversion circuit which performs voltage-conversion on the output current from said current amplification circuit,
wherein said current amplification circuit includes:
a first operational amplifier;
a first feedback resistor connected between an inverting input terminal and an output terminal of said first operational amplifier;
a second feedback resistor connected in parallel to said first feedback resistor;
a third feedback resistor connected between a non-inverting input terminal and the output terminal of said first operational amplifier; and
a first switch inserted between said second feedback resistor and one of the output terminal and the inverting input terminal of said first operational amplifier.

2. The received-light amplifier according to claim 1, wherein respective resistances of said first feedback resistor and said second feedback resistor are not less than 500Ω.

3. The received-light amplifier according to claim 2, wherein said first switch performs switching so that a resistance between the inverting input terminal and the output terminal of said first operational amplifier becomes lower than a resistance between the non-inverting input terminal and the output terminal of said first operational amplifier.

4. The received-light amplifier according to claim 3, wherein said current-voltage conversion circuit includes:
a second operational amplifier which is connected to plural feedback resistors; and
a second switch inserted between the plural feedback resistors and an output terminal of said second operational amplifier.

5. The received-light amplifier according to claim 2, wherein said current-voltage conversion circuit includes:
a second operational amplifier which is connected to plural feedback resistors; and
a second switch inserted between the plural feedback resistors and an output terminal of said second operational amplifier.

6. The received-light amplifier according to claim 1, wherein said first switch performs switching so that a resistance between the inverting input terminal and the output terminal of said first operational amplifier becomes lower than a resistance between the non-inverting input terminal and the output terminal of said first operational amplifier.

7. The received-light amplifier according to claim 1, wherein said current-voltage conversion circuit includes:
a second operational amplifier which is connected to plural feedback resistors; and
a second switch inserted between the plural feedback resistors and an output terminal of said second operational amplifier.

8. An optical pick-up apparatus comprising a received-light amplifier according to claim 1.

* * * * *